US010264712B2

(12) United States Patent
Matteson et al.

(10) Patent No.: US 10,264,712 B2
(45) Date of Patent: Apr. 16, 2019

(54) HARVESTING FACILITY WATER FOR PUMPING SECONDARY FLUID FLOW

(71) Applicant: Lenovo Enterprise Solutions (Singapore) Pte. Ltd., Singapore (SG)

(72) Inventors: Jason A. Matteson, Raleigh, NC (US); Mark E. Steinke, Durham, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 355 days.

(21) Appl. No.: 14/950,635

(22) Filed: Nov. 24, 2015

(65) Prior Publication Data

US 2017/0150653 A1   May 25, 2017

(51) Int. Cl.
| H05K 7/20 | (2006.01) |
| F28D 1/04 | (2006.01) |
| F28F 7/02 | (2006.01) |
| F04D 13/04 | (2006.01) |

(52) U.S. Cl.
CPC ......... *H05K 7/20772* (2013.01); *F04D 13/04* (2013.01); *F28D 1/04* (2013.01); *F28D 1/0408* (2013.01); *F28D 1/0426* (2013.01); *F28F 7/02* (2013.01); *F28F 2250/08* (2013.01); *H05K 7/20763* (2013.01)

(58) Field of Classification Search
CPC ............ H05K 7/20772; H05K 7/20763; F04D 13/04; F28F 2250/08; F28F 7/02; F28D 1/04; F28D 1/0408; F28D 1/0426
USPC ... 165/80.5, 104.18, 104.22, 104.25, 104.28, 165/104.31, 85
See application file for complete search history.

(56) References Cited

U.S. PATENT DOCUMENTS

| 3,888,259 A | * | 6/1975 | Miley ...................... A61F 7/00 607/104 |
| 4,993,483 A | * | 2/1991 | Harris ...................... F24J 3/083 165/104.11 |
| 7,315,448 B1 | * | 1/2008 | Bash .................... H05K 7/2079 165/80.3 |
| 2009/0038781 A1 | * | 2/2009 | Hertweck ............ F04D 13/024 165/104.33 |
| 2015/0052753 A1 | * | 2/2015 | Arvelo ............... H05K 7/20254 29/890.03 |

FOREIGN PATENT DOCUMENTS

| JP | 59138795 A | * | 8/1984 | ............ F04D 13/04 |
| WO | WO 2011122942 A1 | * | 10/2011 | ............. E02F 3/885 |

* cited by examiner

*Primary Examiner* — Frantz F Jules
*Assistant Examiner* — Lionel Nouketcha
(74) *Attorney, Agent, or Firm* — Lieberman & Brandsdorfer, LLC

(57) ABSTRACT

The embodiments described herein relate to generating fluid flow. A pump is positioned adjacent to a heat source. The pump includes a primary chamber having a primary rotational element configured to rotate on an axis, and a secondary chamber having a secondary rotational element configured to rotate on the axis, with a heat transfer element positioned between the primary chamber and the secondary chamber. The primary rotational element is coupled with the secondary rotational element along the axis. A primary fluid is received in the primary chamber with a primary fluid flow, which rotates the primary rotational element. A secondary fluid flow is generated in the secondary chamber by the primary rotational element causing a rotation of the secondary rotational element on the axis.

13 Claims, 5 Drawing Sheets

HARVESTING FACILITY WATER FOR PUMPING SECONDARY FLUID FLOW

BACKGROUND

The embodiments described herein relate to thermal management of electronic equipment. More specifically, the embodiments relate to generating and managing coolant flow using a heat exchanging apparatus within electronic equipment infrastructure.

Heat transfer is a process whereby heat moves from one venue to another venue by radiation, conduction, convection, or a combination of these methods. More specifically, heat transfer flows from a body with a higher temperature to a body with a lower temperature. Liquid cooling is one method of heat transfer wherein fluid is circulated to exchange heat byproduct of electronic equipment, such as processors and other components, using liquid as the heat transfer medium, also referred to as a cooling medium. Processor speeds have increased, and noise associated fans used to maintain a safe operating temperature of the processors has also increase. Liquids are known in the art to have higher thermal conductivities than gases, and thus higher heat transfer coefficients.

There are inherent challenges associated with use of liquid as the heat transfer medium for electronic equipment, including but not limited to leakage, corrosions, extra weight, and condensation. As such, liquid cooling is generally reserved for applications involving power densities that are too high for safe dissipation by air cooling.

SUMMARY

This invention comprises a method and a system for generating fluid flow.

According to one aspect, a method is provided for generating secondary fluid flow. The method includes positioning a pump adjacent to a heat source. The pump includes a primary chamber having a primary rotational element configured to rotate on an axis, and a secondary chamber having a secondary rotational element configured to rotate on the same axis, and a heat transfer element positioned between the primary chamber the secondary chamber. The method further includes coupling the primary rotational element with the secondary rotational element along the axis, receiving a primary fluid in the primary chamber with a primary fluid flow, which rotates the primary rotational element. The method further includes generating a secondary fluid flow in the secondary chamber, which includes the primary rotational element causing rotation of the secondary rotational element on the axis.

According to another aspect, a system is provided to generate secondary fluid flow. A pump is positioned adjacent to a heat source. The pump includes a primary chamber having a primary rotational element configured to rotate, and a secondary chamber having a secondary rotational element configured to rotate on the same axis as the primary rotational element, and a heat transfer element positioned between the primary chamber the secondary chamber. The primary rotational element is coupled with the secondary rotational element along the axis. A primary fluid is received in the primary chamber with a primary fluid flow, which rotates the primary rotational element. A secondary fluid flow is generated in the secondary chamber by the primary rotational element causing rotation of the secondary rotational element on the axis.

Other features and advantages of this invention will become apparent from the following detailed description of the presently preferred embodiment of the invention, taken in conjunction with the accompanying drawings.

BRIEF DESCRIPTION OF THE SEVERAL VIEWS OF THE DRAWINGS

The drawings referenced herein form a part of the specification. Features shown in the drawings are meant as illustrative of only some embodiments of the invention, and not of all embodiments of the invention unless otherwise explicitly indicated. Implications to the contrary are otherwise not to be made.

DETAILED DESCRIPTION

It will be readily understood that the components of the present invention, as generally described and illustrated in the Figures herein, may be arranged and designed in a wide variety of different configurations. Thus, the following detailed description of the embodiments of the apparatus, system, and method of the present invention, as presented in the Figures, is not intended to limit the scope of the invention, as claimed, but is merely representative of selected embodiments of the invention.

Reference throughout this specification to "a select embodiment," "one embodiment," or "an embodiment" means that a particular feature, structure, or characteristic described in connection with the embodiment is included in at least one embodiment of the present invention. Thus, appearances of the phrases "a select embodiment," "in one embodiment," or "in an embodiment" in various places throughout this specification are not necessarily referring to the same embodiment.

Furthermore, the described features, structures, or characteristics may be combined in any suitable manner in one or more embodiments. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

In the following description of the embodiments, reference is made to the accompanying drawings that form a part hereof, and which shows by way of illustration the specific embodiment in which the invention may be practiced. It is to be understood that other embodiments may be utilized because structural changes may be made without departing from the scope of the present invention.

Figure 1:
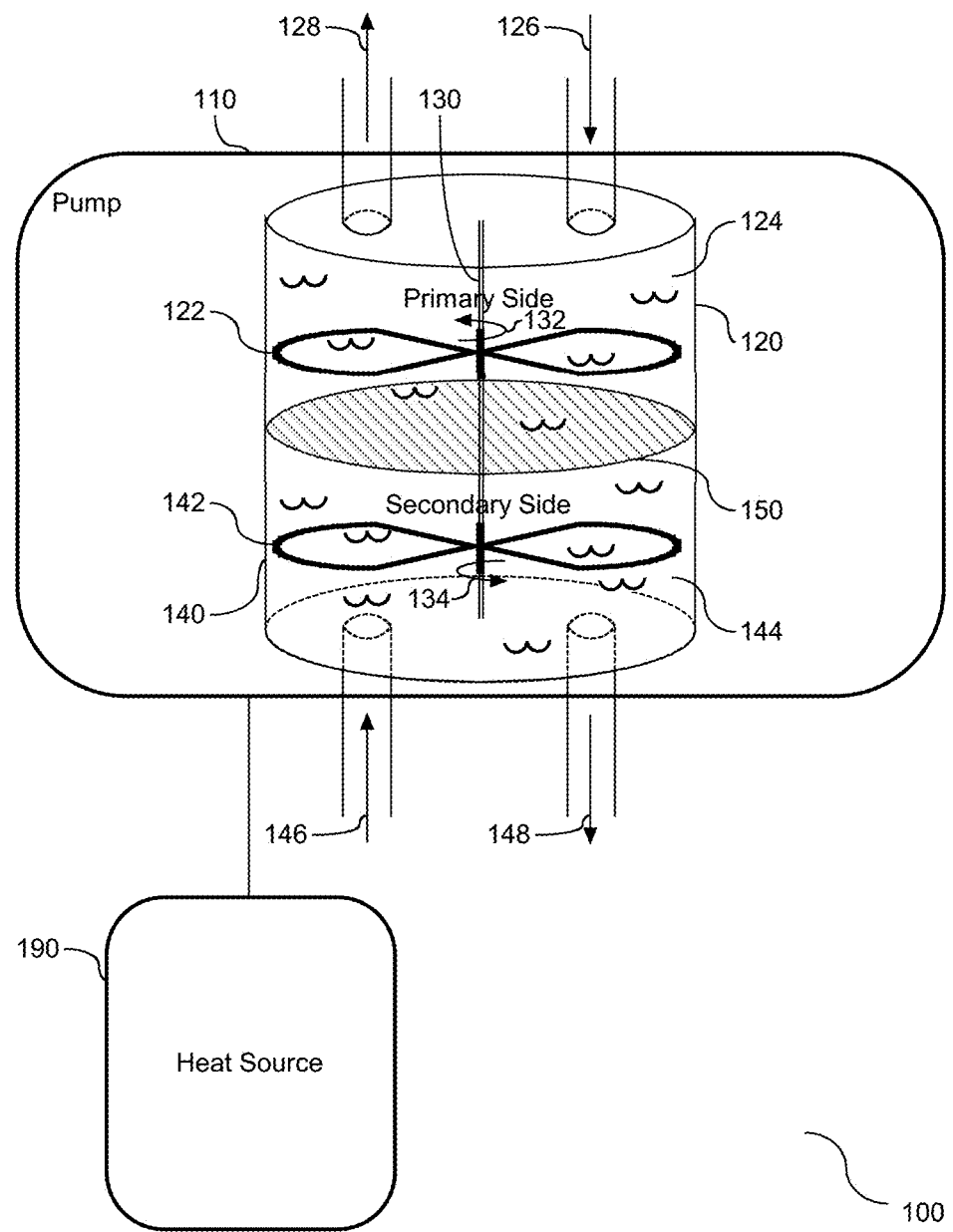
FIG. 1 depicts a block diagram illustrating a pump apparatus.

Referring to FIG. 1, a block diagram (100) is provided illustrating a pump apparatus, also referred to herein as a pump that may be used within a heat exchanger system to cool electronic equipment. As shown, a pump (110) is provided and placed adjacent to a heat source (190). The pump (110) includes a primary chamber (120) with one or more a primary blades (122) attached to a rotational element (130) within the primary chamber (110). The primary blades (122) are objects attached to the rotational element (130) that rotates and pushes fluid (not shown) in the primary chamber. In one embodiment, the rotational element (130) is a shaft used to transmit power by rotation. As shown herein, rotational element (130) is configured to rotate on an axis, as demonstrated by a primary axial direction (132).

Similarly, a secondary chamber (140) is shown adjacently positioned to the primary chamber (110). The secondary chamber (140) includes secondary blades (142) attached to the rotational element (130) within the secondary chamber (140). Similar to the primary blades (122), the secondary blades (142) are objects attached to the rotational element (130) within the secondary chamber (140), with the secondary blades (142) configured to rotate with the rotational element (130) and push fluid (not shown) in the secondary chamber. As shown herein, rotational element (130) in the secondary chamber (140) is configured to rotate on an axis, as demonstrated by a secondary axial direction (134). Accordingly, the primary and secondary axial directions (132) and (134), respectively, are the axial direction of the rotational element (130).

The primary chamber (120) is shown adjacently positioned to the secondary chamber (140) with a rotational element (130) extending through both chambers. In one embodiment, the primary blade (122) is a part of a primary impeller (not shown) housed within the primary chamber (120), and functions to force fluid in the primary chamber (120) in a specific direction. Similarly, in one embodiment, the secondary blade (142) is a part of a secondary impeller (not shown) housed within the secondary chamber (140), and functions to force fluid in the secondary chamber (140) in a specific direction. Impellers are known in the art, and a detailed description will not be provided herein.

As shown, a plate (150) is shown adjacently positioned to both the primary and secondary chamber (120) and (140), respectively. The plate (150) separates the primary and secondary chambers. In one embodiment, the plate (150) functions as a heat transfer element between the chambers. The plate (150) may be comprised of aluminum or another material comprised of a heat conducting alloy to enhance heat transfer. Accordingly, the pump apparatus is shown comprised of four primary components, including the primary chamber (120) and the associated primary components, the secondary chamber (140) and the associated secondary components, the plate (150), and the rotational element (130) that extends through the primary and secondary chambers (120) and (140), respectively.

Two separate fluids are shown for use with the pump. A primary fluid (124) is shown in communication with the primary chamber (120), and a secondary fluid (144) is shown in communication with the secondary chamber (140). More specifically, the primary fluid (124) is isolated from the secondary fluid (144) by the plate (150). The primary fluid (124) enters the primary chamber (120) at (126), and exits the primary chamber (120) at (128). Similarly, the secondary fluid (144) enters the secondary chambers (140) at (146) and exits the secondary chamber (140) at (148). In one embodiment, rotation of the primary fluid (124) is referred to as a primary loop, and rotation of the secondary fluid is referred to as a secondary loop, with the primary and secondary loops being separate isolated loops. The impellers in each of the primary and secondary chambers (120) and (140) are on the same rotational axis. As further shown herein, the primary fluid (124) and the associated flow rate drives the pump, so that the fluid flow of the primary fluid (124) drives the primary impeller, which rotates the rotational element (130), thereby driving the secondary impeller and generating a fluid flow of the secondary fluid (144). In one embodiment, the fluid flows of the primary and secondary fluids (124) and (144), respectively, are concurrent, so that the primary fluid (124) passes through the primary chamber (120) simultaneous with the secondary fluid (144) passing through the secondary chamber (140).

The primary fluid (124) is shown as a cooling fluid, e.g. chilled water, received from a facility. In one embodiment, the primary fluid (124) is not processed with chemicals to prevent corrosion of electronic equipment since the primary fluid is isolated to the primary chamber and not directly exposed to the equipment. The secondary fluid (144) is shown as warm fluid, or warm with regard to the operating temperature of the primary fluid (124). The secondary fluid (144) is also referred to herein as operating in communication with a server node or in close proximity to a server node and associated electronic components. As such, the secondary fluid (144) is treated or otherwise cleansed to prevent corrosion of materials within the server node and associated electronic components.

In one embodiment, heat transfer between the primary and secondary fluids (124) and (144), respectively, takes place across the plate (150), therefore, plate (150) is a heat transfer element. More specifically, the secondary fluid (144) absorbs heat generated by a heat source or heat by-product of associated electronic equipment, thereby increasing the operating temperature of the secondary fluid (144) in comparison to the operating temperature of the primary fluid (124). The operating temperature of the secondary fluid (144) is reduced by the relatively lower operating temperature of the primary fluid (124), with the temperature transfer taking place across the plate (150). In one embodiment, the plate (150) is an impervious barrier separating the primary and secondary chambers (120) and (140), respectively. Similarly, in one embodiment, the plate (150) is comprised of a heat conductive medium. Accordingly, the primary and secondary fluids remain separate with the plate (150) facilitating transfer of heat between the separate fluids.

Figure 2:
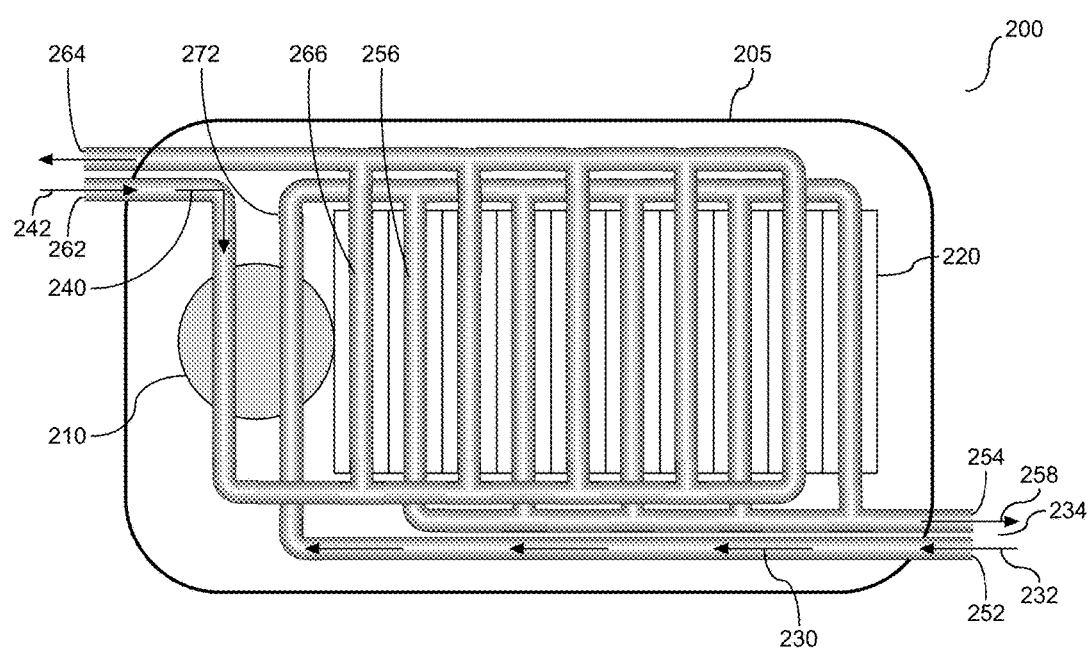
FIG. 2 depicts a block diagram illustrating a heat exchange system implementing the pump apparatus of FIG. 1.

Referring to FIG. 2, a block diagram (200) is provided illustrating a system (205) that includes the pump shown in FIG. 1 positioned in communication with a heat exchanger. As shown, there are two primary components of the system (205) in the form of a pump (210) and a heat exchanger (220). The pump (210) and the heat exchanger (220) are shown herein to form a heat transfer system from a top view. There are two fluid flows, including a primary fluid flow (230) and a secondary fluid flow (240). The heat exchanger (220) shown herein is configured with adjacently positioned channels and cavities to separately receive and process the primary and secondary fluids, respectively. More specifically, there are two sets of channels and cavities, includes a first set comprising a first entry channel (252), a first exit channel (254), and a first cavity (256), and a second set comprising a second entry channel (262), a second exit channel (264), and a second cavity (266). In one embodiment, each set of channels and cavities may be configured with a plurality of channels and cavities. Regardless of the quantity of channels and cavities, the first set is limited to communication with the primary fluid flow (230) and the second set is limited to communication with the secondary fluid flow (240). More specifically, the primary and secondary fluids remain separate fluid flows and do not mix.

As shown, the primary fluid (232) of the primary fluid flow (230) enters the system from a primary facility side (234) and enters the pump (210), and more specifically the primary side of the pump (210). In one embodiment, the pump (210) is based on the structure and components shown and described in FIG. 1. The primary fluid (232) moves at a rate of speed referred to herein as a primary fluid flow. The movement of the primary fluid (232) causes movement of one or more primary blades in the pump (210), and effectively causes the pump shaft to rotate about its axis. As shown herein, the primary fluid (232) travels through an entry channel (252) from the point of entry at (234), to the primary side of the pump (210) and into the heat exchanger (220). As the primary fluid flow (230) exits the pump it enters cavity (256) of the heat exchanger, and upon completing its passage through the cavity (256), the fluid flow enters the primary exit channel (254), which directs the primary fluid to exit the system at the primary fluid exit (258). In one embodiment, there are multiple cavities (256) arranged in parallel, with the primary fluid (230) entering each cavity (256) from the pump and exiting the cavity (256) into the primary exit channel (254).

Similar to the primary fluid flow, the secondary fluid (242) enters the system from a secondary side and into the pump (210), and more specifically, the secondary side of the pump (210). The secondary fluid (242) moves at a rate of speed referred to herein as a secondary fluid flow. The fluid flow rate of the secondary fluid (242) is dictated by the fluid flow rate of the primary fluid flow. As shown herein, the second fluid travels through an entry channel (262) from the point of entry, to the secondary side of the pump (210) and into the heat exchanger. Heat between the primary and secondary fluids is exchanged across a pump membrane, such as the plate shown and described in FIG. 1, and in addition across the cavities of the heat exchanger. As the secondary fluid exits the pump it enters a secondary fluid entry channel (272), passes through cavity (266) and into a secondary exit channel (264). In one embodiment, there are multiple secondary cavities (266) arranged in parallel, with the secondary fluid (242) entering each cavity (266) from the secondary fluid entry channel (262) and exiting the cavity (266) into the secondary fluid exit channel (264).

As shown herein, the primary fluid (232) flows through the primary channels and cavities positioned adjacent to the secondary fluid (242) which flows through the secondary channels and cavities. This adjacent positioning enables heat from the secondary fluid flow to transfer to the primary fluid prior to exiting the heat exchanger at the primary fluid exit (264). In one embodiment, the primary and secondary fluids (232) and (242), respectively, flow in opposite directions through the pump (210) and the heat exchanger (220). Similarly, in one embodiment, the primary fluid is received from an external source at a primary fluid temperature, and the secondary fluid is received from an internal source at a secondary fluid temperature, with the primary fluid temperature being greater than the secondary fluid temperature, thereby enabling the secondary fluid to effectively transfer heat to the primary fluid. Accordingly, as demonstrated, heat transfer takes place across the pump membrane and across the primary and secondary cavities, respectively.

Figure 3:
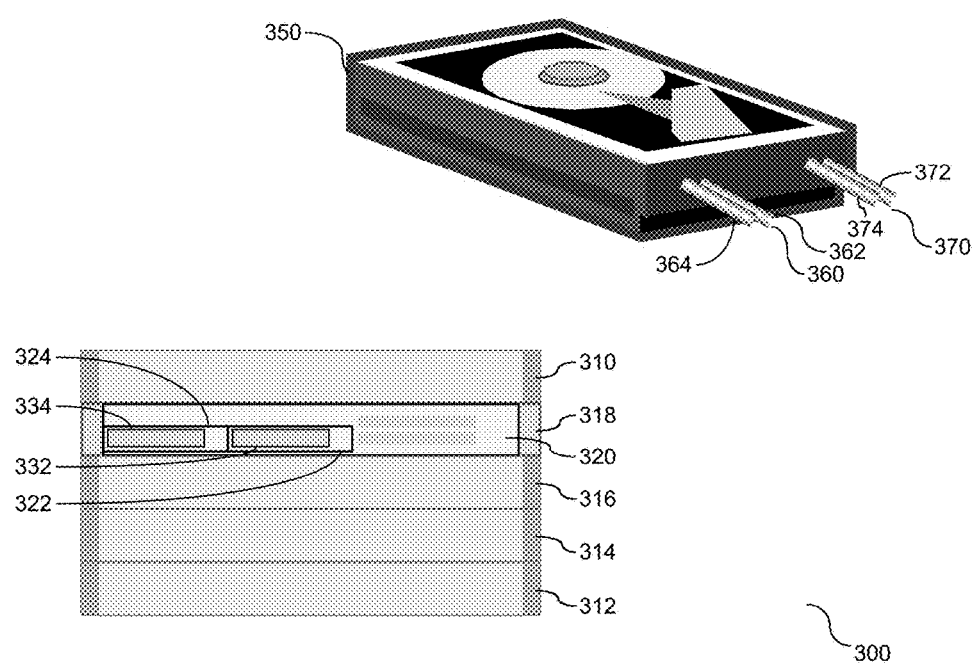
FIG. 3 depicts a block diagram illustrating a server node.

Referring to FIG. 3, a block diagram (300) of a server node is shown and described. As shown, a rack (310) is provided to house the server node (320). The rack (310) is shown herein with a plurality of bays (312), (314), (316), and (318). Although only four bays are shown, the quantity of bays should not be considered limiting. Each bay is designed to hold a unit of equipment, such as a computer server node. The unit of equipment is generally standard with the width being uniform, and the height being measured in units. As shown, a server node (320) is positioned within the bay (318) of the rack (310). The remaining bays (312)-(316) are shown herein as empty, although in one embodiment, these bays may receive and house equipment. The server node (320) is shown with two openings (322) and (324), each of these opening configured to receive a hard disk drive. The first opening (322) is shown with hard disk drive (332). The second opening (324) is shown in receipt of a heat exchange unit (334). More specifically, the unit (334) is the system of the pump, e.g. positive displacement pump, and heat exchanger, as shown and described in FIG. 2, enveloped within a housing and placed in the second opening (324).

The unit (334) is shown in detail at (350). As shown, the unit receives secondary fluid (360) at a secondary fluid point of entry (362), and a primary fluid (370) at a primary fluid point of entry (372). Similarly, the second fluid (360) is shown to exit the unit at (364), and the primary fluid (370) is shown to exit the unit at (374). The self-encapsulation of the pump unit (334) enables the heat exchange system to be placed within a rack mount server node (320) so that the fluid cooling system shown and described herein directly attends to the server node using an existing opening within the server node (320).

Figure 4:
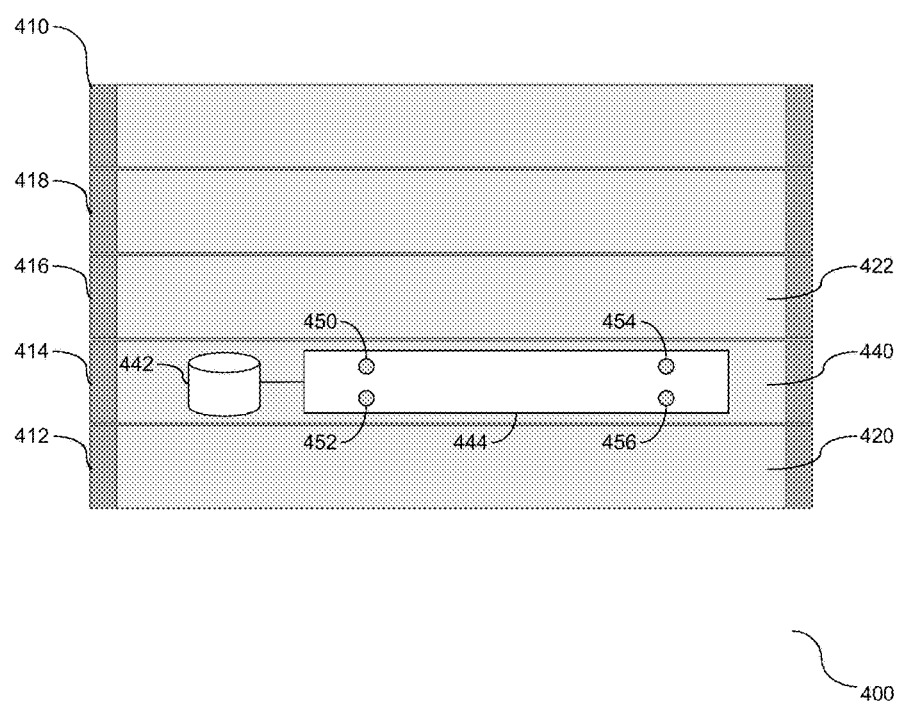
FIG. 4 depicts a block diagram illustrating a rack for housing the heat exchange system of FIG. 2

Referring to FIG. 4, a block diagram (400) of a rack is provided to house the heat exchange system. The rack (410) is shown herein with a plurality of bays (412), (414), (416), and (418). Although only four bays are shown, the quantity of bays should not be considered limiting. Each bay is designed to hold a unit of equipment, such as a computer server node. The unit of equipment is generally standard with the width being uniform, and the height being measured in units. As shown, a first server node (420) is positioned within the first bay (412) of the rack (410), a heat exchange unit (440) is positioned within the second bay (414) of the rack (410), and a second server node (422) is positioned within the third bay (416) of the rack (410). The fourth bay is shown herein as empty, although in one embodiment, this bay may receive and house equipment.

The heat exchange unit (440) is shown measuring one unit, and thereby occupying one bay (414) in the rack (410). More specifically, the heat exchange unit (440) is sized to be received in the rack (410) at (414), with the heat exchange unit (440) including the system components of the pump and heat exchanger, as shown and described in FIG. 2. The configuration of the heat exchange unit allows the cooling functionality to serve multiple nodes house in the rack (410), including the first server node (420) and the second server node (422). In one embodiment, the heat exchange unit (440) is referred to as a chiller distribution unit (CDU), and functions to support heat exchange to one or more heat generating components in the rack (410).

The heat exchange unit (440) includes a pump (442) in communication with a heat exchanger (444), as shown and described in FIG. 2. The heat exchange unit (440) is shown with four openings (450), (452), (454), and (456), each of these openings configured to receive fluid flow. The unit (440) receives secondary fluid at a secondary fluid point of entry (450), and a primary fluid at a primary fluid point of entry (452). Similarly, the second fluid is shown to exit the unit (440) at (454), and the primary fluid is shown to exit the unit (440) at (456). The self-encapsulation of the heat exchange unit (440) enables the heat exchange system to be placed within a rack mount adjacently positioned to one or more server nodes. In one embodiment, the heat exchange unit (440) has greater heat transfer capacity that the system shown in FIG. 3 placed within a bay of a server node.

Accordingly, the heat exchange unit (440) brings the fluid cooling system directly to the rack and the servers housed in the rack.

Figure 5:
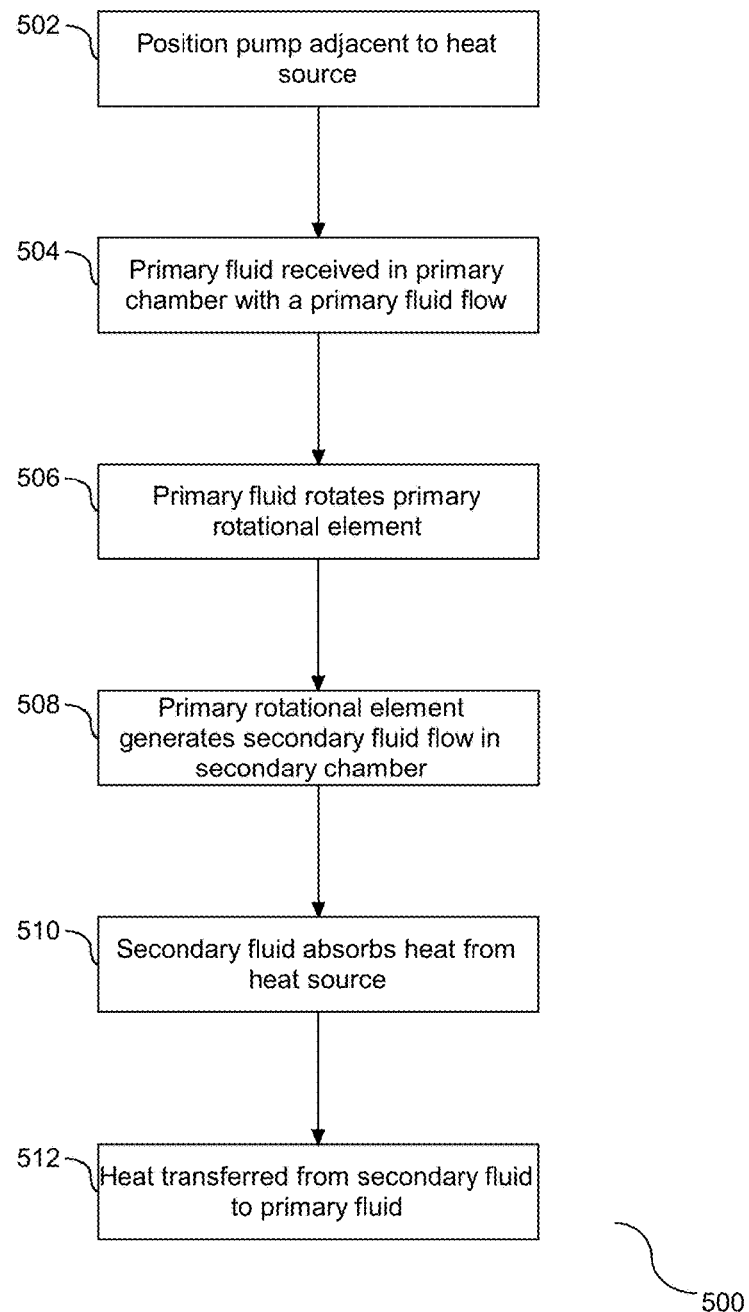
FIG. 5 depicts a flow chart illustrating a process for operating the heat exchange system of FIGS. 1-4.

Referring to FIG. 5, a flow chart (500) is provided illustrating a method for operating the heat exchange system shown and described in FIGS. 1-4. A pump is positioned adjacent to a heat source (502). In one embodiment, the positioning of the pump at step (502) places the pump in communication with a server rack mount, as shown and described in FIG. 3, or in one embodiment the pump may be positioned as a unit within the server rack mount and in communication with separately mounted units within the server rack, as shown and described in FIG. 4. A primary fluid is received in the primary chamber with a primary fluid flow (504), and the primary fluid flow rotates the primary rotational element (506). The rotation of the primary rotational element generates a secondary fluid flow in the secondary chamber (508). In one embodiment, the pump is designed to harvest a pressure differential between a facility side and a node side to generate the secondary fluid flow in the secondary chamber at step (508). In other words, the secondary fluid flow may be generated at step (508) via a pressure gradient. The pump is designed to pass the received primary fluid flow and the generated secondary fluid flow through the primary and secondary chambers, respectively. In one embodiment, the primary fluid passes through the primary chamber simultaneously with the secondary fluid passing through the secondary chamber. Accordingly, the pump is a bilateral apparatus designed to deliver fluids separately from two different sources.

The pump may be implemented as a component of a heat transfer system. The secondary fluid absorbs heat generated by a heat source (510), and the generated heat is transferred from the secondary fluid to the primary fluid (512). As is known in the art, heat transfer occurs in the presence of a temperature gradient established between materials and/or fluids in thermal communication until the temperature gradient is reduced to equilibrium. In one embodiment, heat transfer may be used as a cooling mechanism by transferring heat from the heat source to matter having a colder temperature. Accordingly, in order to cool the secondary fluid, the primary fluid is received at a temperature that is colder than the secondary fluid.

Referring to the system shown and described in FIG. 2, a heat exchanger may be further positioned in communication with the pump. The heat exchanger is configured with channels and at least one cavity for each of the fluid flows, including a primary channel in communication with the primary chamber of the pump to receive the primary fluid flow, and a secondary channel in communication with the secondary chamber of the pump to receive the secondary fluid flow. In one embodiment, the heat transfer at (512) includes the pump delivering the primary and secondary fluids through the heat exchanger via the primary and secondary channels, respectively, and the secondary fluid transferring the absorbed heat to the primary fluid across the heat exchanger. Furthermore, the element of the pump may be comprised of a heat conductive medium, and the heat transfer at step (512) includes the secondary fluid transferring the absorbed heat to the primary fluid across the element. Accordingly, a heat exchanger may be provided to facilitate cooling of the secondary fluid, and the element of the pump may be implemented as a heat transfer element to enhance overall heat transfer between the primary and secondary fluids.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

It will be appreciated that, although specific embodiments of the invention have been described herein for purposes of illustration, various modifications may be made without departing from the spirit and scope of the invention. Accordingly, the scope of protection of this invention is limited only by the following claims and their equivalents.

We claim:

1. A method comprising:
    enveloping a pump within a heat source, the pump comprising:
        a primary chamber, the primary chamber comprising a primary rotational blade configured to rotate on an axis;
        a secondary chamber, the secondary chamber comprising a secondary rotational blade configured to rotate on the axis; and
        a plate that enhances heat transfer positioned between the primary chamber and the secondary chamber;
    rotatably coupling the primary rotational blade with the secondary rotational blade on a common rotational shaft extending through the heat transfer plate along the axis;
    receiving a primary fluid in the primary chamber with a primary fluid flow, and the primary fluid flow rotating the primary rotational blade;
    generating a secondary fluid flow in the secondary chamber, including the primary rotational blade causing a rotation of the secondary rotational blade; and
    positioning a heat exchanger in communication with the pump, the heat exchanger including a primary channel in communication with the primary chamber of the pump to receive the primary fluid flow, and a secondary channel in communication with the secondary chamber of the pump to receive the secondary fluid flow, wherein the secondary fluid absorbs heat generated by the heat source and transfers the absorbed heat to the primary fluid across the heat exchanger, wherein the heat exchanger is enclosed within the heat source.

2. The method of claim 1, wherein the plate is an impervious barrier separating the first and second chambers.

3. The method of claim 1, wherein the primary fluid is received at a first temperature, and wherein the secondary fluid is at a second temperature greater than the first temperature.

4. The method of claim 1, further comprising the primary fluid passing through the primary chamber simultaneously with the secondary fluid passing through the secondary chamber.

5. The method of claim 1, further comprising positioning the pump and the heat exchanger in communication with a server rack mount.

6. The method of claim 5, further comprising positioning the pump and the heat exchanger as a unit within the server rack mount, and in communication with a separately mounted unit within the rack.

7. A system comprising:
a pump enclosed within a heat source, the pump comprising:
  a primary chamber comprising a primary rotational blade configured to rotate on an axis, the primary chamber to receive a primary fluid with a primary fluid flow, wherein the primary fluid flow rotates the primary rotational blade;
  a secondary chamber, the secondary chamber comprising a secondary rotational blade configured to rotate on the axis, wherein the primary rotational blade is rotatably coupled with the secondary rotational blade on a common rotational shaft along the axis, and wherein the primary rotational blade causes a rotation of the secondary rotational blade to generate a secondary fluid flow in the secondary chamber;
  a plate that enhances heat transfer positioned between the primary chamber and the secondary chamber, wherein the common rotational shaft extends through the heat transfer plate; and
a heat exchanger positioned in communication with the pump, the heat exchanger including a primary channel in communication with the primary chamber of the pump to receive the primary fluid flow, and a secondary channel in communication with the secondary chamber of the pump to receive the secondary fluid flow, wherein the secondary fluid absorbs heat generated by the heat source and transfers the absorbed heat to the primary fluid across the heat exchanger, wherein the heat exchanger is enclosed within the heat source.

8. The system of claim 7, wherein the heat transfer element is an impervious barrier comprised of a heat conductive medium, wherein the heat transfer plate separates the first and second chambers.

9. The system of claim 7, wherein the primary fluid is received at a first temperature, and wherein the secondary fluid is at a second temperature greater than the first temperature.

10. The system of claim 7, wherein the primary fluid passes through the primary chamber and the secondary fluid passes through the secondary chamber simultaneously.

11. The system of claim 10, wherein the unit is a chiller distribution unit (CDU).

12. The system of claim 7, further comprising a server rack mount, wherein the pump and the heat exchanger are positioned in communication with the server rack mount.

13. The system of claim 12, wherein the pump and the heat exchanger are positioned as a unit within the server rack mount, and in communication with a separately mounted unit within the server rack mount.

* * * * *